(12) United States Patent
Wu (10) Patent No.: US 8,635,761 B2
(45) Date of Patent: Jan. 28, 2014

(54) SYSTEM AND METHOD FOR FORMATION OF ELECTRICAL CONDUCTORS ON A SUBSTRATE

(75) Inventor: Yiliang Wu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 229 days.

(21) Appl. No.: 13/236,265

(22) Filed: Sep. 19, 2011

(65) Prior Publication Data

US 2013/0068511 A1 Mar. 21, 2013

(51) Int. Cl.
*H01R 43/00* (2006.01)

(52) U.S. Cl.
USPC ............... 29/600; 29/831; 29/830; 29/846; 340/572.7

(58) Field of Classification Search
USPC .............. 29/592.1, 600, 601, 830–832; 343/700 MS, 868, 877; 340/572.1–572.5
See application file for complete search history.

(56) References Cited

U.S. PATENT DOCUMENTS

| | | | | |
|---|---|---|---|---|
| 4,778,552 A | * | 10/1988 | Benge et al. | 156/272.2 |
| 5,197,185 A | * | 3/1993 | McCoy et al. | 29/848 |
| 5,763,058 A | * | 6/1998 | Isen et al. | 428/209 |
| 6,031,458 A | * | 2/2000 | Jacobsen et al. | 340/572.5 |
| 6,147,662 A | * | 11/2000 | Grabau et al. | 343/895 |
| 7,211,205 B2 | | 5/2007 | Conaghan et al. | |
| 7,578,048 B2 | | 8/2009 | Wollach et al. | |
| 7,653,982 B2 | | 2/2010 | Chopra et al. | |
| 7,888,169 B2 | | 2/2011 | Mohapatra et al. | |
| 2006/0158478 A1 | | 7/2006 | Howarth et al. | |
| 2006/0163744 A1 | | 7/2006 | Vanheusden et al. | |
| 2007/0104884 A1 | | 5/2007 | Conaghan et al. | |
| 2007/0170403 A1 | | 7/2007 | Conaghan et al. | |
| 2007/0188327 A1 | | 8/2007 | Keeton et al. | |
| 2009/0130299 A1 | | 5/2009 | Chopra et al. | |
| 2009/0142481 A1 | | 6/2009 | Chopra et al. | |
| 2009/0226605 A1 | | 9/2009 | Chopra et al. | |
| 2009/0288567 A1 | | 11/2009 | Choi et al. | |
| 2010/0323102 A1 | | 12/2010 | Chopra et al. | |
| 2011/0017831 A1 | | 1/2011 | Picon et al. | |

OTHER PUBLICATIONS

Sure, Patrick; "The silver ink printed antenna"; published by Global IDentification; Oct. 2005 (3 pages).
Rida, Amin et al.; "Design and Characterization of Novel Paper-based Inkjet-Printed UHF Antennas for RFID and Sensing Applications"; IEEE Antennas and Propagation Society International Symposium; Jun. 2007 (4 pages).

* cited by examiner

*Primary Examiner* — Minh Trinh
(74) *Attorney, Agent, or Firm* — Maginot, Moore & Beck, LLP (57) ABSTRACT

A method for printing an electrical conductor on a substrate has been developed. In the method, a reverse image of the electrical conductor pattern is printed on a substrate with an electrically non-conductive material to form a second pattern that exposes a portion of the surface area of the substrate. The entire surface area of the substrate is then covered with an electrically conductive material. The non-conductive material of the reverse image electrically isolates the electrically conductive material covering the reverse image from the electrically conductive material covering the second pattern.

11 Claims, 7 Drawing Sheets

SYSTEM AND METHOD FOR FORMATION OF ELECTRICAL CONDUCTORS ON A SUBSTRATE

TECHNICAL FIELD

This disclosure relates generally to methods for forming electrical conductors on a substrate and, more particularly, to using a printer in a process for forming electrically conductive traces on a substrate.

BACKGROUND

Many modern electronic devices include planar electrical conductors that are formed on a substrate. The electrical conductors are patterned into various shapes or electrical "traces." In some configurations, the traces electrically connect various components affixed to the substrate, act as antennas for radio transmitters and receivers, and provide a ground plane. Printed circuit boards (PCBs) are a common example of a substrate, typically a polymer layer, with thin traces of electrically conductive materials, such as copper or aluminum, formed on one or both sides of the substrate.

Recent advances in electronics have led to increasingly smaller and less expensive electronic devices used in a growing number of applications. One such device is the radio frequency identifier (RFID) tag. A typical passive RFID tag includes a small microchip that is electrically connected to an antenna. When an RFID tag reader is positioned near the RFID tag, the electrical energy emitted by the reader energizes the microchip in the RFID tag and the RFID tag transmits data from the microchip to the RFID reader. The microchip in the RFID tag is programmed with various product codes or other data that are typically used to identify the object to which the RFID tag is affixed.

The antenna in the RFID tag serves at least two purposes. First, the antenna couples the electrical energy transmitted by the RFID reader to the microchip in the RFID tag. Second, the antenna enables the RFID tag to transmit data back to the RFID reader. In a typical RFID tag, the antenna is an electrical trace formed on a substrate such as plastic.

Processes for manufacturing electrical traces for RFID tags and other electronic devices are known. A typical process completely covers the substrate with a thin metal layer. Next, a layer of resist material is applied to selected portions of the metal layer. The resist material is applied with the same pattern as the desired electrical traces to be formed on the substrate, e.g., in the shape of an antenna. After the resist material is applied, an etching process, which typically includes acid, dissolves any metal that is not covered by the resist material. Care must be taken in selecting a substrate to ensure the substrate is not dissolved by the acid. Additionally, the substrate needs to be substantially non-porous so the acid does not diffuse through the substrate and dissolve metal that is formed under the resist layer. Once the etching process is completed, some or all of the resist material is stripped away to enable the electrical traces to be connected to various electrical components that are placed on the substrate.

The existing techniques for forming electrical conductors and electrical traces on different substrates have drawbacks due to the complexity of the process for forming the electrical traces. For example, existing techniques require an etching process to form the pattern. Additionally, the materials required for existing processes may increase the cost of production for each device or produce environmentally harmful waste. Thus, improved systems and processes for production of electrical conductors on various substrates are beneficial.

SUMMARY

In one embodiment, a method of forming an electrical conductor on a substrate has been developed. The method includes printing a first pattern on a substrate with an electrically non-conductive material to form a second pattern on the substrate that is substantially free of the electrically non-conductive material, the substrate having a surface area that is essentially comprised of the first pattern and the second pattern, and applying an electrically conductive material to the surface area of the substrate to cover the electrically non-conductive material of the first pattern and the substrate essentially free of the electrically non-conductive material to enable the electrically conductive material covering the second pattern to operate as an electrical conductor electrically isolated from the electrically conductive material covering the electrically non-conductive material applied in the first pattern.

In another embodiment, an electrical circuit formed on a substrate has been developed. The electrical circuit includes an electrically non-conductive material formed in a first pattern on the substrate, the first pattern covering only a first portion of a surface area of the substrate to form a second pattern that exposes a second portion of the surface area of the substrate, and an electrically conductive material that covers the electrically non-conductive material formed in the first pattern and the exposed second portion of the surface area of the substrate, the electrically conductive material covering the second portion of the surface area of the substrate exposed by the second pattern being electrically isolated from the electrically conductive material covering the electrically non-conductive material formed in the first pattern on the substrate.

BRIEF DESCRIPTION OF THE DRAWINGS

FIG. 2D-1 is a magnified view of 2D.

FIG. 2F-1 is a magnified view of 2F.

DETAILED DESCRIPTION

For a general understanding of the environment for the system and method disclosed herein as well as the details for the system and method, reference is made to the drawings. In the drawings, like reference numerals have been used throughout to designate like elements. As used herein, the term "electrical conductor" refers to any arrangement of a material that enables an electrical current to flow through the material for a practical application such as an electrical circuit or to act as a radio antenna. Common examples of electrical conductors include metals, such as copper or aluminum, formed in a continuous path such as in a wire or planar electrical trace. Planar electrical traces refer to thin layers of an electrical conductor formed along a continuous path on a substrate such as electrical traces formed on printed circuit boards. As used herein, the term "electrical insulator" or "electrically non-conductive material" refers to any material that resists or blocks the flow of electricity for a practical application. As explained in more detail below, a material that is commonly electrically conductive, such as copper, can be configured as an electrical insulator if the conductive material does not form a continuous path to enable a flow of electric current.

As used herein the term "printer" refers to any device that is configured to print images on an image receiving surface. Common examples of printers include, but are not limited to, xerographic and inkjet printers. Various printer embodiments use one or more marking agents, such as ink or toner, to form printed images in various patterns. An image receiving surface refers to any surface that receives a marking agent, such as an imaging drum, imaging belt, or various print media including paper. The term "substrate" refers to a print medium, such as paper, that holds both printed images and electrical conductors formed on one or two sides of the substrate. In some embodiments, the printer is a digital printer. Digital printers enable an operator to design and modify image data to alter the image printed on the substrate easily using, for example, commercially available image editing software.

As described in more detail below, a printer is configured print a "negative image" on a substrate as part of a process of forming electrical conductors in the shape of various electrical circuits on the substrate. As used herein, the terms "negative image" and "reverse image" are used interchangeably and refer to a printed image where an electrically non-conductive material, such as toner or ink, is printed in a pattern that corresponds to only the locations on the substrate that do not correspond to intended locations of electrical circuits. The electrically non-conductive toner or ink in the negative image is formed from an electrically non-conductive material that coats a portion of the substrate. A second pattern formed on the bare substrate corresponds to the shape and arrangement of electrical circuits that are formed on bare portions of the substrate outside of the negative printed image.

One type of printer is a cut-sheet printer that forms images on individual sheets of a print medium such as paper. The printer forms one or more images on each cut sheet, including negative images of electrical circuits. In some configurations, cut-sheet printers print relatively small numbers of substrates for low volume production or for prototyping electrical circuits that are formed on paper substrates. Once an electrical circuit pattern image is verified as being effective for its intended purpose, a continuous feed printer uses the previously verified images as part of large-scale production of the electrical circuits.

A continuous feed or "web" printer produces images on a continuous web print substrate such paper. In some configurations, continuous feed printers receive image substrate material from large, heavy rolls of paper that move through the printer continuously instead of as individually cut sheets. The paper rolls can typically be provided at a lower cost per printed page than pre-cut sheets. Each such roll provides an elongated supply of paper printing substrate in a defined width. Fan-fold or computer form web substrates may be used in some printers having feeders that engage sprocket holes in the edges of the substrate. After formation of the images and/or electrical conductors on the media web, one or more cutting devices separate the web into individual sheets of various sizes. A series of repeating electrical circuits may be arranged on the media web and the individual circuits separated from the media web using the cutting process. Some embodiments use continuous feed printing systems to print a large number of images in a time and cost efficient manner.

As used herein, the term "surface roughness" refers to a measured variation in the height of a surface of a material. Various roughness metrics are used in the art to describe the roughness of substrates, such as paper, and the roughness of marking agent patterns formed on the substrates. One commonly used roughness metric is known as an $R_a$ parameter. As used herein, the $R_a$ parameter refers to an arithmetic average of the absolute values of height variations measured over an area of a surface. For example, the $R_a$ of various substrates, such as paper, varies from about 50 nm to 1.2 µm, and some grades of paper used in printing have an $R_a$ from about 100 nm to 1.0 µm. In a multi-layer configuration, the surface roughness of a substrate layer affects the distribution of one or more material layers formed on the substrate layer.

Figure 1:
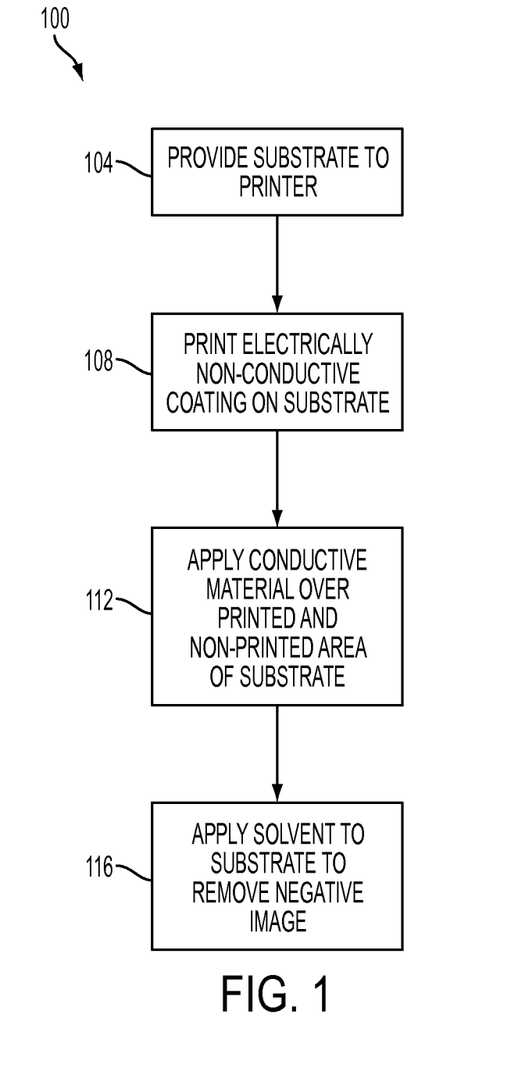
FIG. 1 is a block diagram of a process of forming an electrical conductor on a substrate.

FIG. 1 depicts a process 100 of forming one or more electrical conductors on a substrate such as paper. Process 100 is described in conjunction with the exemplary embodiments of FIG. 2A-FIG. 2H for illustrative purposes. Process 100 begins by providing a substrate to a printer (block 104). In cut-sheet printer embodiments, the substrate typically includes a stack of media sheets placed in a media tray within the printer. In a continuous feed printer, the print medium is provided as a media roll that is threaded through a print zone in the continuous feed printer. A xerographic printer and an inkjet printer are two examples of printers that print images on the substrate. Various printer configurations print images on one or both sides of a continuous roll or individual cut-sheet of the substrate.

Figure 2A:
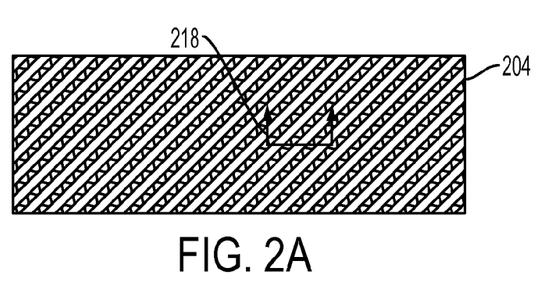
FIG. 2A is a plan view of a material such as plain paper that is used as a substrate for an electrical conductor.
Figure 2B:
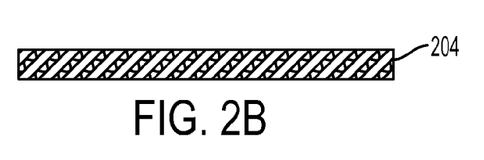
FIG. 2B is a partial cross-sectional of FIG. 2A taken along line 218.

FIG. 2A and FIG. 2B depict an exemplary paper substrate 204 suitable for printing by a xerographic or inkjet printer. FIG. 2A is a top view of the paper substrate 204, and FIG. 2B is a partial cross-sectional view of the substrate 204 taken along line 218. Various types of paper, including plain paper without coatings, such as wax or plastic coatings, are suitable for use as a substrate. In the configuration of FIG. 2A-FIG. 2B, the substrate 204 is electrically non-conductive to enable one or more electrical conductors formed on the substrate 204 to operate without leaking substantial amounts of electrical current through the substrate 204. The substrate 204 includes a surface area that can be used to support one or more electrical conductors.

Figure 2C:
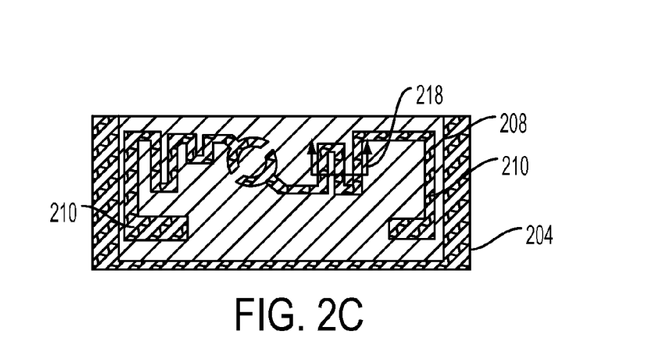
FIG. 2C is a plan view of the substrate of FIG. 2A with an electrically non-conductive material pattern printed on the substrate.
Figure 2D:
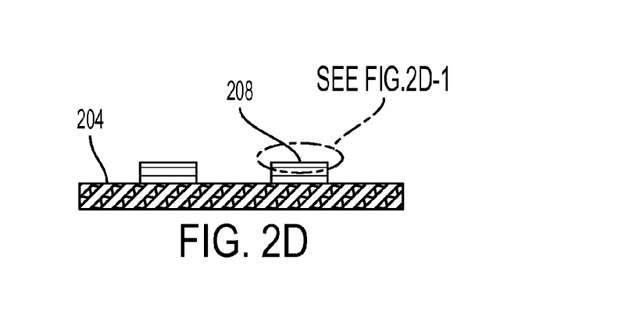
FIG. 2D is a partial cross-sectional view of FIG. 2C taken along line 218.
Figure 2D:
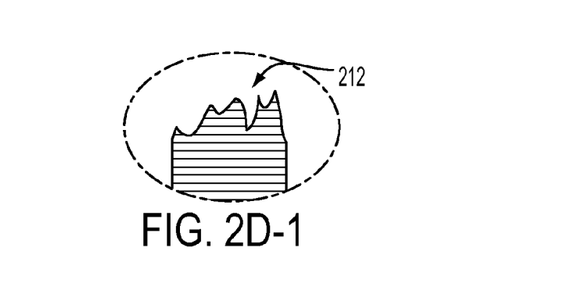

Once supplied with the substrate, the printer prints an electrically non-conductive image on the substrate to form an electrically non-conductive pattern on a selected portion of the substrate (block 108). FIG. 2C and FIG. 2D depict a printed negative image, shown as a printed pattern 208. The image is formed from an electrically non-conductive material that coats a portion of the substrate 204. FIG. 2D depicts a cross-sectional view of the substrate 204 and printed pattern 208 taken along line 218 including a surface 212 of the electrically non-conductive material. As shown in FIG. 2C and FIG. 2D, a printed negative image pattern 208 coats a selected portion of the substrate 204 with an electrically non-conductive material.

Two examples of electrically non-conductive materials are emulsion aggregation toners and phase-change inks. In various embodiments, a xerographic printing system prints the pattern 208 with an emulsion aggregation toner, and a phase-change inkjet printing system prints the pattern 208 with a phase change ink. The printer prints the electrically non-conductive pattern 208 on the substrate 204 as a negative image that surrounds one or more unprinted regions 210. The unprinted regions 210 form a pattern corresponding to the shape of one or more electrical conductors prior to the formation of electrical conductors on the substrate 204. The pattern formed in the pattern 208 covers a portion of the surface area of the substrate 204, leaving the exposed portions, such as the unprinted areas 210, substantially free of the marking agent to form a second pattern on the substrate that corresponds to the shape of an electrical conductor.

In the embodiment of FIG. 2C-2D, the thickness of the electrically non-conductive layer is approximately 8 µm. In other embodiments, the thickness of electrically non-conductive material ranges from about 1.0 µm to 50 µm. The density of marking agent and the type of marking agent used to form the printed image affect the thickness of the electrically non-conductive pattern 208. Some printer configurations print duplicates of the image onto the substrate in a multi-pass configuration to form thicker layers of the non-conductive material.

Once the non-conductive image is printed on the substrate, a layer of electrically conductive material is applied to the substrate 204 and to the surface 212 of the non-conductive pattern 208 (block 112). In one embodiment, a solution containing a dissolved metal, such as silver, copper, copper-silver alloy, or aluminum in particle form, which is dispersed in a liquid media, is applied to the substrate 204. The solvent in the solution evaporates and leaves a layer of the metal formed over both the exposed portions of the substrate 204 and the surface of the printed image 212. In one embodiment of FIG. 2A-FIG. 2G, copper is deposited in a layer that is approximately 220 nm thick.

In another embodiment, the electrically conductive material is applied by vacuum evaporation or sputtering of a metal such as copper or aluminum. In one embodiment, the substrate is at room temperature (approximately 25° C.). In other embodiments, the substrate together with the pre-printed electrically non-conductive material is heated to an elevated substrate temperature, with some embodiments heating the substrate in a range from approximately 40° C. to 120° C. The substrate 204 and the electrically non-conductive material in the pattern 208 are heated to a temperature that is higher than a softening point temperature of the toner or the phase change ink marking agent, which forms the first pattern. At the elevated temperature, the marking agent softens to enable absorption of a portion of the electrically conductive material into the electrically non-conductive marking agent in the pattern 208. The elevated temperature is also low enough that the marking agent in the electrically non-conductive material in the pattern 208 does not flow or otherwise distort the shape of the printed image during application of the electrically conductive material.

In various embodiments, the thickness of electrically conductive layer 216 is between about 50 nm and 10 µm, with some embodiments forming the conductive layer with a thickness of about 100 nm to 5 µm. In some embodiments, the difference between the thickness of the electrically non-conductive image and the electrically conductive layer is at least 500 nm, while other embodiments have a minimum difference in thickness of greater than 2.0 µm. An optional metallic plating process using electroplating or electroless plating can increase the thickness of an electrical conductor after formation of an initial layer of an electrically conductive material on the surface of the substrate.

Figure 2E:
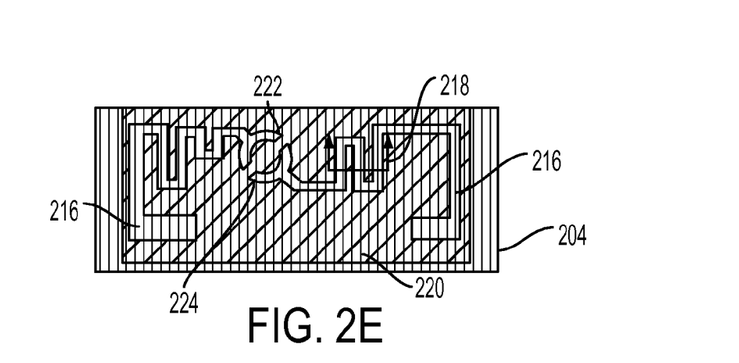
FIG. 2E is a plan view of the substrate and electrically non-conductive material of FIG. 2C with a layer of an electrically conductive material formed over the substrate and the material.
Figure 2F:
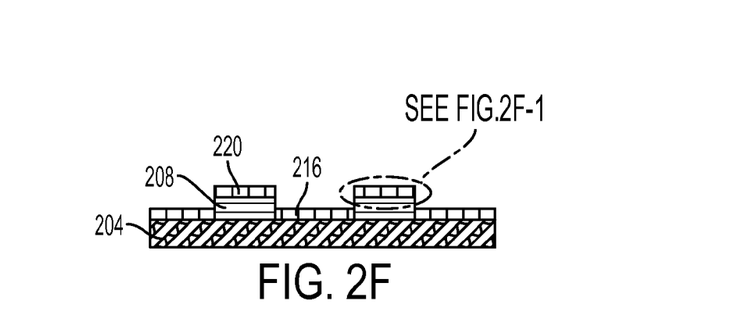
FIG. 2F is a partial cross-sectional view of FIG. 2E taken along line 218.
Figure 2F:
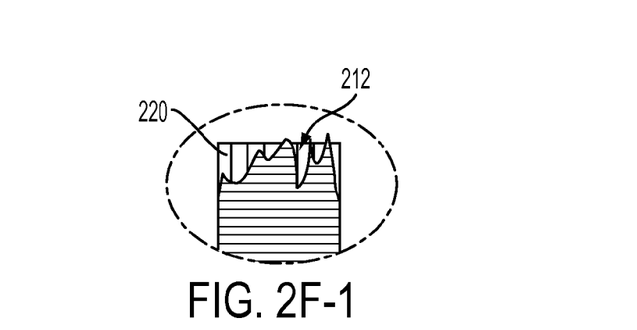

FIG. 2E depicts a plan view of electrical conductors 216 and the electrically conductive material 220 that is formed over the electrically non-conductive pattern 208. FIG. 2F depicts a partial cross-sectional view of FIG. 2E taken along line 218, including a view of the electrically conductive material 220 formed on the surface 212 of the electrically non-conductive pattern 208. In the configuration of FIG. 2E and FIG. 2F, electrical conductors 216 are formed in the unprinted pattern 210 on the surface of the substrate 204. The substrate 204 is selected to have a surface that is smooth enough to enable the deposited metal in the electrical conductors 216 to form a continuous electrical conductor. Various stocks of commercially available uncoated paper provide a suitable substrate for the formation of the electrical conductors 216.

The electrical conductors 216 are configured as an antenna for a radio frequency identification device (RFID) with electrical contacts 222 and 224 that are electrically connected to an RFID (not shown) that is mounted on the substrate 204. In other configurations, the printed pattern 208, unprinted pattern 210, and electrical conductors 216 are formed in a wide variety of patterns that provide electrical conductors for various types of electrical circuit.

The electrically conductive material is formed over both the unprinted pattern 210 to form the conductors 216 and the non-conductive pattern 208 to form a layer 220 that is either substantially electrically non-conductive or less electrically conductive than the conductors 216. The electrically non-conductive pattern 208 electrically isolates the conductors 216 in at least two ways. First, the thickness of the electrically non-conductive material in the pattern 208 separates the electrical conductors 216 from the electrically conductive material 220 formed on the surface of the non-conductive pattern 208. In the example of FIG. 2E and FIG. 2F, the electrically non-conductive pattern 208 is approximately 8 µm thick, while the electrical conductors 216 are approximately 220 nm thick and are positioned below the surface 212 of the non-conductive pattern 208.

The electrically non-conductive pattern 208 also includes a surface 212 that provides a larger surface roughness than the underlying substrate 204. The surface roughness of the non-conductive pattern 208 prevents the electrically conductive material 220 from forming a continuous layer of material that enables a flow of electrical current. In the example embodiment, the surface 212 of the electrically non-conductive pattern 208 has an $R_a$ of approximately 1.5 µm, which is larger than the approximately 220 nm thickness of the electrically conductive layer 220.

In other embodiments, the $R_a$ of an electrically non-conductive material in a printed image is between about 100 nm and 10 µm, with some embodiments having a roughness of between 500 nm and 5 µm. In some embodiments, the surface roughness Ra parameter of the electrically non-conductive material exceeds the Ra parameter of the substrate by at least 100 nm to 500 nm. In other embodiments, the surface roughness of the electrically non-conductive material does not differ substantially from the substrate. As described below, at least a portion of the electrically conductive material penetrates into the electrically non-conductive material in embodiments where the surface roughness of the electrically non-conductive material is similar to that of the substrate.

In some embodiments, the non-conductive pattern 208 absorbs a portion of the electrically conductive material 220 to prevent the electrically conductive material 220 from forming an electrically conductive layer on the electrically non-conductive pattern 208. As described above, vacuum evaporation processes that heat and soften the marking agent are an example of an application process in which a portion of the electrically conductive material 220 is absorbed into the electrically non-conductive material of the pattern 208. The metallic atoms in the electrical conductor 220 diffuse as the electrical conductor penetrates the electrically non-conductive pattern 208, and the resulting combination of the electrically non-conductive material with the absorbed conductive material has a high electrical resistance.

The configuration of the electrically non-conductive material in the printed pattern 208 isolates the electrically conductive material 220 from the electrical conductors 216 and prevents the electrically conductive material 220 from forming a separate electrical conductor. In the exemplary configuration of FIG. 2E and FIG. 2F, the electrical conductors 216 have an electrical resistance of approximately 55Ω while the electrical resistance over the layer 220 on the printed pattern 208 has a resistance of greater than $10^9 \Omega$. In various other configurations, the electrically conductive material formed directly on the substrate, such as the electrical conductors 216, has an electrical conductivity of 1,000 S/cm to over 10,000 S/cm. The electrically conductive material formed over the non-conductive pattern 208 has a lower electrical conductivity that is typically in a range of $10^{-5}$ S/cm to less than $10^{-10}$ S/cm to form an effective electrical insulator for various electrical circuits.

In some embodiments, process 100 is concluded after deposition of the electrically conductive material on the substrate 204 and non-conductive material in the pattern 208. FIG. 2E and FIG. 2F depict functional electrical conductors 216 formed as an antenna on the substrate 204, and in the exemplary embodiment an RFID is electrically connected to the antenna contacts 222 and 224. Unlike prior art configurations, the surfaces of the antenna conductors 216 are free of a resist material, and no additional processes are required to prepare the antenna contacts 222 and 224 for electrical connection to an RFID. Also, no additional process is required to etch the conductive material, since the conductive material is already formed in the shape of an RFID antenna or other electrical circuit. As described above, the electrically non-conductive pattern 208 and layer of electrically conductive material 220 are electrically isolated from the conductors 216 and an RFID mounted on the substrate 204 operates with the antenna formed from the conductors 216.

Figure 2G:
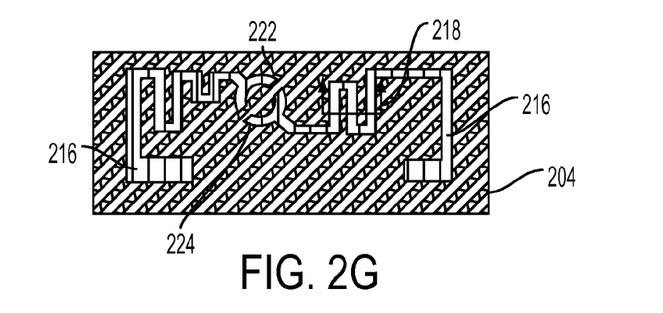
FIG. 2G is a plan view of the substrate of FIG. 2E after an optional application of a solvent removes the electrically non-conductive material and electrically conductive material formed on the electrically non-conductive material.
Figure 2H:
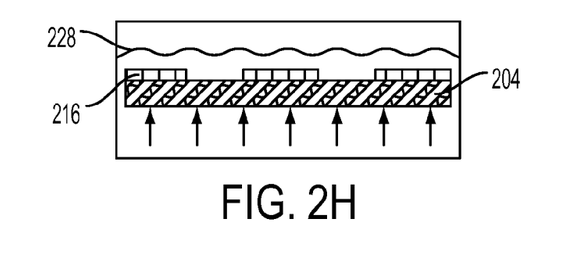
FIG. 2H is a partial cross-sectional view of the FIG. 2G taken along line 218.

Some embodiments of process 100 include an optional application of a solvent to remove the electrically non-conductive material in the pattern 208 from the substrate 204 (block 116). FIG. 2G and FIG. 2H depict an optional configuration in which the solvent removes the electrically non-conductive material in the pattern 208 and the electrically conductive material 220 from the substrate 204. FIG. 2G depicts a plan view of the substrate 204 and the electrical conductors 216 without the electrically non-conductive pattern 208 and electrically conductive material 220. FIG. 2H depicts a partial cross sectional view of FIG. 2G taken along line 218.

FIG. 2H also depicts a solvent 228 that penetrates the substrate 204. The solvent 228 dissolves the electrically non-conductive pattern 208 while leaving the substrate 204 and electrical conductors 216 substantially intact. Unlike solvents used to remove metal from a substrate, the solvent 228 does not dissolve the metallic electrical conductor 216 and does not require a resist material to protect the electrical conductor 216. The electrically conductive layer 220 formed on the electrically non-conductive pattern 208 disintegrates into the solvent as the electrically non-conductive pattern 208 dissolves, leaving an electrical circuit with the conductors 216 on the substrate 204.

In one embodiment, toluene is used as the solvent 220 to dissolve both emulsion aggregate toners and phase change inks while leaving paper and metallic layers of copper or aluminum intact. The substrate 204 is immersed in the toluene solvent 220 for approximately 30 seconds to remove the electrically non-conductive pattern 208 and the electrically conductive material 220. The porous substrate 204 enables solvent 228 to penetrate through the non-imaged side of the substrate 204 to reach the electrically non-conductive material in the pattern 208. Some embodiments of process 100 include the recycling of the electrically conductive material 220 after application of the solvent 228 for use in forming additional electrical circuits.

Toluene is one example of a solvent, but various other solvents are suitable to dissolve the non-conductive pattern 208. For example, hydrocarbon solvents including an aliphatic hydrocarbon solvent, such as hexane, cyclohexane, and heptanes; aromatic hydrocarbon, such as toluene, xylene, trimethyl benzene, ethyl benzene, and the like; esters, such as ethyl acetate; ethers, such as THF; ketones, such as acetone, MIBK; amides, such as NMP, DMF, and the like; are all suitable to dissolve the electrically non-conductive material without damaging the substrate 204 and electrical conductors 216. Treatment times last between one second and 30 minutes, with typical treatment times being between 5 seconds and 1 minute. In one embodiment, a treatment time of less than 30 seconds enables application of the solvent to a continuous media web prior rolling the media web into a pickup roll after a plurality of conductors are formed on the media web.

Process 100 can be used to generate a wide variety of electrical conductors and circuits on an inexpensive substrate such as paper. In alternative configurations, the conductors can be used establish electrical connections between two or more surface mount electrical components including processors, memories, sensor devices, visual display devices, radio transceivers, and batteries. Some embodiments of the process form electrical components from the electrical conductors in the circuit. For example, variations in the length and width of an electrical conductor form a resistor, and an electrical trace that is patterned in a concentric spiral forms an inductor.

While FIG. 2A-FIG. 2H depict an electrical conductor formed on one side of the substrate, the process 100 can also form electrical conductors on both sides of a substrate. In one configuration, a duplex printing process forms electrically non-conductive images on both sides of the substrate 204. In that embodiment of process 100, the electrically conductive material is deposited on both sides of the substrate in a single process as described above at block 112. The double-sided conductors enable formation of more complex arrangements of electrical circuits or electrical circuits with a smaller areal size on the substrate. Additionally, corresponding electrical conductors formed on either side of the substrate 204 can form a capacitor with the substrate 204 acting as a dielectric for the capacitor.

Figure 3:
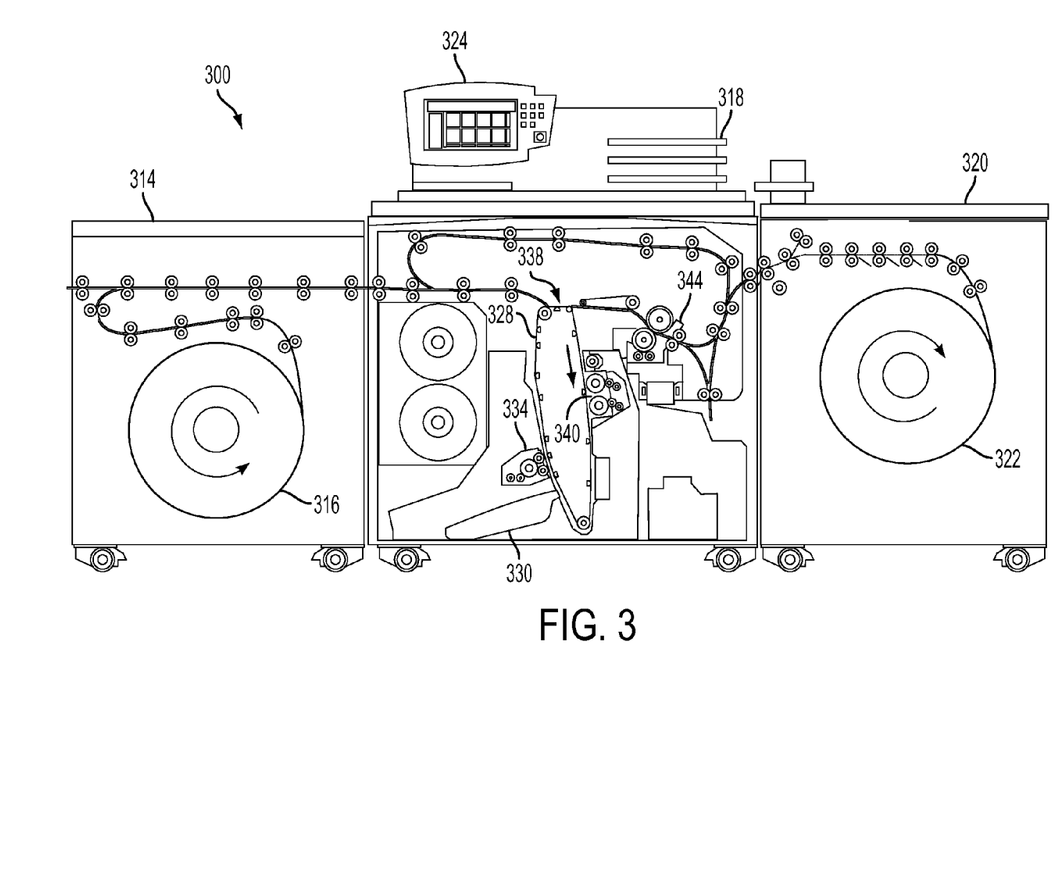
FIG. 3 is a schematic view of a xerographic printing system that is configured to print the electrically non-conductive pattern depicted in FIG. 2C-FIG. 2E.

FIG. 3 depicts a xerographic printer 300 that is configured to print a negative image described above with an electrically non-conductive emulsion aggregate toner on a substrate. The printer 300 includes a feeder unit 314, a printing unit 318, and an output unit 320. The feeder unit 314 houses a continuous roll 316 of a print medium substrate, such as paper, that unwinds from the feeder unit through the printing unit 318. The printing unit 318 prints images of the electrically non-conductive pattern 208 onto the substrate and fixes the images to the substrate. The print medium subsequently moves to the output unit 320 where the medium winds onto a pickup roll 322. The imaged substrate in the pickup roll 322 typically includes a large number of printed negative images corresponding to one or more electrical circuit configurations. In a system that performs process 100, the pickup roll 322 is removed from the printer 300 and the electrically conductive layers are applied by another system on the images formed on the roll 322.

The printing unit 318 includes an operator console 324 where job tickets may be reviewed and/or modified for print jobs performed by the machine 300. The pages to be printed during a print job may be scanned by the printer 300 or received over an electrical communication link. In the configuration of process 100, the printer 300 receives rasterized data corresponding to the configuration of one or more electrical conductors to be formed on the substrate. Some print jobs specify a "positive" image of electrical conductors where the rasterized image data correspond to the electrical conductors formed on the substrate. The printer 300 is configurable to invert a positive rasterized image to a negative rasterized image and the printer 300 leaves the areas corresponding to the electrical conductors blank on the substrate. Some configurations of the printer 300 convert a non-rasterized data format, such as data in a Gerber format, into corresponding rasterized image data for printing on the substrate.

The print unit 308 generates bit data with reference to the rasterized image data and provides the bit data to a raster output scanner (ROS) 330 to form a latent image on a photoreceptor 328. In one embodiment, the ROS 330 is a laser that selectively shines laser light onto the photoreceptor 328 in locations corresponding to the negative image data. In the configuration of printer 300, the photoreceptor 328 is a belt that continuously travels the circuit depicted in the figure in the direction indicated by the arrow. Other xerographic printers use a rotating drum as the photoreceptor.

A development subsystem 334 develops toner on the photoreceptor 328. In the printer 300, the toner is an emulsion aggregate toner. In one embodiment, the emulsion aggregate toner is optically transparent, although toners of various colors can be used as well. The application of the toner to the substrate controls a surface roughness of the printed image on the substrate. The surface roughness of the image can be controlled, for example, by using different fusing pressures, different fusing temperatures, or using different fuser materials. High pressure applied in the fusing process results in low surface roughness, while low pressure produces a higher surface roughness. Generally, a higher fusing temperature results in a lower surface roughness, while a lower fusing temperature results in a higher surface roughness. The toner material employed by the printer also affects the image surface roughness. Toners that include a gel component are examples of toners that generate printed images with a high surface roughness for use with the process 100.

A transfer station 338 generates an electric field that transfers the toner conforming to the latent image from the photoreceptor 328 to the substrate. The substrate bearing the toner image travels to a fuser station 344 that applies heat and pressure to fix the image onto the substrate. The substrate then moves to the output unit 320 and winds onto the pickup roll 322.

The printer 300 is an example of one embodiment of a xerographic printer that is configured to generate electrically non-conductive images on paper as described in process 100. Alternative xerographic printer embodiments, including cut-sheet printers, are also suitable to implement the process 100.

Figure 4:
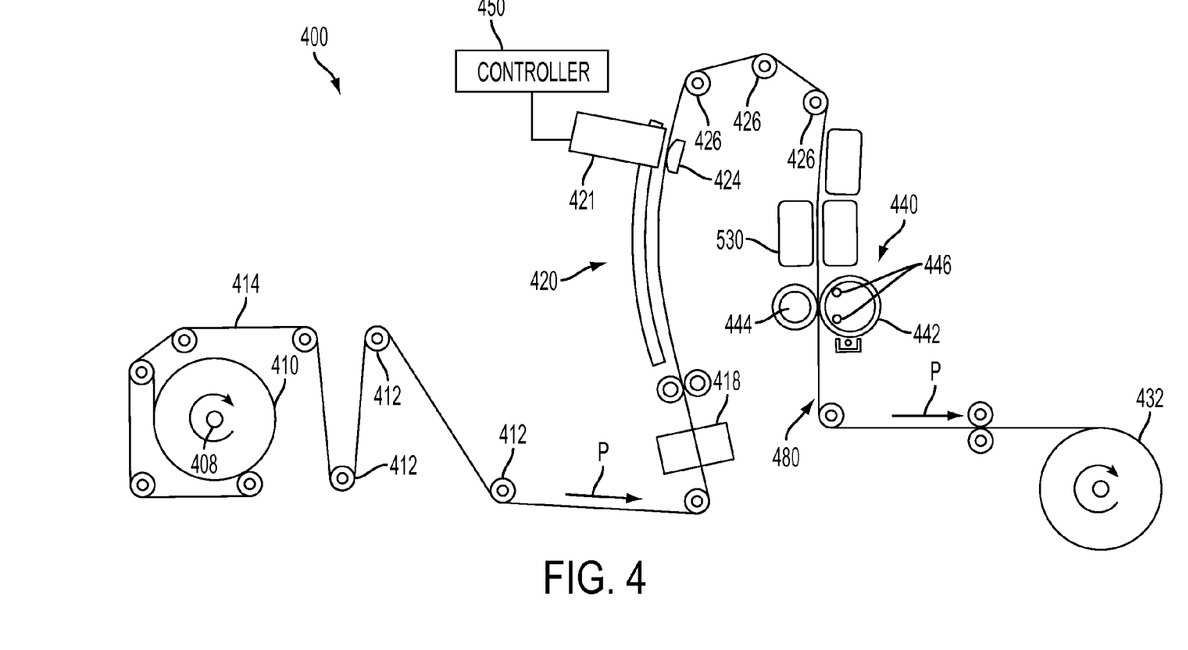
FIG. 4 is a schematic view of a phase-change inkjet printing system that is configured to print the electrically non-conductive pattern depicted in FIG. 2C-FIG. 2E.

FIG. 4 depicts a phase change inkjet printer 400 that is configured to print the negative pattern described above with an electrically non-conductive ink onto a substrate. The printer 400 includes a controller 450, inkjet printing unit 421, and a media path P configured to guide a substrate, depicted as media web 414, from a supply roll 408 to a pickup roll 432. In operation, the inkjet printing unit 421 ejects liquid drops of a phase change ink onto the media web 414 to form a pattern of electrically non-conductive ink on the media web 414.

A phase change ink is substantially solid at room temperature and substantially liquid when heated to a phase change ink melting temperature for jetting onto the media web 414. In one embodiment, the phase change ink melting temperature is approximately 70° C. to 140° C. In alternative embodiments, the ink utilized in the printer may comprise UV curable gel ink. Gel ink may also be heated before being ejected by the inkjet ejectors of the printhead. As used herein, liquid ink refers to melted solid ink, heated gel ink, or other known forms of ink, such as aqueous inks, ink emulsions, ink suspensions, ink solutions, or the like. Phase change inks provide advantages for printing the negative images on the media web 414 since phase change inks form a layer over the media web 414 instead of being absorbed into the media web 414. Thus, phase change inks are suited to forming a layer of electrically non-conductive material that is thicker than the electrical conductors formed on the substrate as depicted above in FIG. 2F.

The controller 450 processes image data and generates electrical control signals for inkjet ejectors in the inkjet print unit 421 to control ejection of ink drops onto the media web 414. The controller 450 generates the electrical control signals to operate the inkjet printing unit 421 to form images on the media web 414 corresponding to negative images of electrical conductors formed on the media web 414. The controller 450 can convert positive image data of the electrical conductors into a negative image. The controller 450 receives bitmap image data corresponding to a rasterized image in some embodiments, and in other embodiments the controller 450 is configured to generate a bitmap image from a non-rasterized data format such as Gerber data.

The print unit 421 includes one or more printheads that each include a plurality of ink ejectors. The printheads are arranged across a width of the media web 414 to enable ink ejectors to cover the media web 414 with ink drops to form the electrically non-conductive pattern. FIG. 4 depicts a single ink station 421, but alternative embodiments of the printer 400 include multiple ink stations that eject ink drops having various colors onto the media web 414. In some embodiments, one print station ejects ink to form the electrically non-conductive pattern, and a second print station ejects another type of ink to print information, such as images or text, on the substrate.

In operation, the media web 414 unwinds from the source roll 410 and is propelled by a variety of motors, not shown, that rotate one or more rollers positioned along the media path P. A media conditioner includes rollers 412 and a pre-heater 418. The rollers 412 control the tension of the unwinding media web 414 as the media transport moves the media web along the media path P. In alternative embodiments, the media substrate moves through the path in cut sheet form in which case the media supply and handling system may include any suitable device or structure that enables the transport of cut media sheets along a desired path through the printer. The pre-heater 18 brings the web to an initial predetermined temperature that is selected for desired image characteristics corresponding to the type of media being printed as well as the type, colors, and number of inks being used. Embodiments of the pre-heater 418 use contact, radiant, conductive, or convective heat to bring the media to a target preheat temperature, which in one practical embodiment, is in a range of about 30° C. to about 70° C.

The media substrate is transported through a print zone 420 that includes the print unit 421. The controller 450 receives velocity data from encoders mounted proximate to a media backer 424 opposite the printheads in the print unit 421 to calculate the linear velocity and position of the web as the web moves past the printheads. The controller 450 uses these data to generate timing signals for actuating the ink ejectors in the printheads to enable the printheads to eject ink with appropriate timing and accuracy for registration of the negative circuit images on the media web 414. The controller 450 generates electrical firing signals to actuate each of the ink ejectors with reference to the image data processed by the controller 450.

Following the printing zone 420 along the media path are one or more "mid-heaters" 430. Embodiments of the mid-heater 430 use contact, radiant, conductive, and/or convective heat to control a temperature of the media. The mid-heater 30 brings the ink placed on the media to a temperature suitable for desired properties when the ink on the media is sent through a spreader 440. In one embodiment, a useful range for a target temperature for the mid-heater is about 35° C. to about 80° C. The mid-heater 430 has the effect of equalizing the ink and substrate temperatures to within about 15° C. of each other. Lower ink temperature gives less line spread while higher ink temperature causes show-through (visibility of the image from the other side of the print). The mid-heater 30 adjusts substrate and ink temperatures to 0° C. to 20° C. above the temperature of the spreader.

Following the mid-heaters 430, a fixing assembly 440 is configured to apply heat and/or pressure to the media to fix the images to the media. The fixing assembly may include any suitable device or apparatus for fixing images to the media including heated or unheated pressure rollers, radiant heaters, heat lamps, and the like. In the embodiment of the FIG. 1, the fixing assembly includes a "spreader" 440, that applies a predetermined pressure, and in some implementations, heat, to the media. The spreader 440 includes rollers, such as image-side roller 42 and pressure roller 44, to apply heat and pressure to the media. Either roller can include heat elements, such as heating elements 446, to bring the media web 414 to a temperature in a range from about 35° C. to about 80° C. In alternative embodiments, the fixing assembly spreads the ink using non-contact heating (without pressure) of the media after the print zone 420. Such a non-contact fixing assembly may use any suitable type of heater to heat the media to a desired temperature, such as a radiant heater, UV heating lamps, and the like.

The spreader 440 applies the pressure and heat to combine individual ink droplets positioned on the media web 414 into larger ink images. As described above, the non-conductive pattern 208 in the printed image has a surface 212 with a roughness that prevents the electrically conductive material 220 from forming an electrical conductor. The amount of heat applied by the mid-heater 430 and the amount of pressure applied by the spreader 440 provide consistent coverage of the ink in the ink while also providing a textured surface with an appropriate level of surface roughness for process 100.

Following passage through the spreader 440 the media web 414 is wound onto a pickup roll 432. In alternative configurations, the media web 414 undergoes duplex printing. In one configuration, the media web threads through a media web inverter and a second printer having the same configuration as printer 400 a second time for duplex printing. In another configuration, the media web 414 feeds through the web inverter that flips the media web and feeds the media web 414 through the media path P in tandem with the first side of the media web 414. While printing system 300 is depicted as a direct inkjet printer, alternative inkjet printers include indirect printers that form latent ink images on an imaging drum or belt and transfix the ink images to print media.

Both printers 300 and 400 are configured to print images with an electrically non-conductive marking agent that has a sufficient surface roughness to prevent the electrically conductive material formed over the marking agent from forming an electrical conductor. In the printers 300 and 400, one print job parameter that affects the surface roughness of printed images is the "gloss level" of the printed image. As used herein, the term "gloss level" refers to a level of specular reflection of an image formed on the substrate, with a high gloss image having a higher degree of specular reflection and a low gloss image having a lower degree of specular reflection. The surface roughness of a printed image affects the gloss level of the printed image, with low gloss level images having a higher surface roughness that reduces specular reflections of light from the printed image. Some printer embodiments include a gloss level parameter as part of a print job. When the printer prints an image in a low gloss or "matte" print mode, the printer produces a printed image with a surface roughness suitable for use with the process 100.

It will be appreciated that variants of the above-disclosed and other features and functions, or alternatives thereof, may be desirably combined into many other different systems, applications or methods. Various presently unforeseen or unanticipated alternatives, modifications, variations or improvements therein may be subsequently made by those skilled in the art, which are also intended to be encompassed by the following claims.

I claim:

1. A method of forming an electrical conductor on a substrate comprising:

printing a first pattern on a substrate with an electrically non-conductive material to form a second pattern on the substrate that is substantially free of the electrically non-conductive material, the substrate having a surface area that is essentially comprised of the first pattern and the second pattern;

applying by vacuum evaporation an electrically conductive material to the surface area of the substrate to cover the electrically non-conductive material of the first pattern and the substrate essentially free of the electrically non-conductive material to enable the electrically conductive material covering the second pattern to operate as an electrical conductor electrically isolated from the electrically conductive material covering the electrically non-conductive material applied in the first pattern; and heating the substrate and the electrically non-conductive material to a temperature higher than a softening point of the electrically non-conductive material prior to and during the vacuum evaporation, the electrically non-conductive material essentially comprising one of an emulsion aggregation toner and a phase-change ink.

2. The method of claim 1 further comprising:
applying a solvent to dissolve the first pattern of electrically non-conductive materials and remove the electrically conductive material covering the first pattern on the substrate.

3. The method of claim 2 wherein the electrically non-conductive material and the electrically conductive material are applied to a first side of the substrate and the solvent is applied to a second side of the substrate.

4. The method of claim 1, the printing of the first pattern with the electrically non-conductive material further comprising: applying the electrically non-conductive material to the substrate with a xerographic imaging device.

5. The method of claim 4, the application of the electrically non-conductive material with the xerographic imaging device further comprising:
applying electrically non-conductive material that is essentially comprised of an emulsion aggregation toner with the xerographic imaging device to the substrate.

6. The method of claim 1, the printing of the first pattern with the electrically non-conductive material further comprising: applying the electrically non-conductive material to the substrate with an inkjet printing device.

7. The method of claim 6, the application of the electrically non-conductive material further comprising:
applying electrically non-conductive material that is essentially comprised of a phase-change ink with the inkjet printing device to the substrate.

8. The method of claim 1, the printing of the first pattern further comprising:
applying electrically non-conductive material to a paper substrate.

9. The method of claim 1, the application of the electrically conductive material by vacuum evaporation to cover the second pattern further comprising:
forming an antenna for at least one of transmission and reception of electromagnetic signals.

10. The method of claim 1, the heating of the substrate and the electrically non-conductive material further comprising:
heating the substrate and the electrically non-conductive material to a temperature between approximately 45° C. and 115° C. prior to and during the vacuum evaporation.

11. The method of claim 1, the printing of the first pattern on the substrate further comprising:
printing the first pattern with a printer operated in a low gloss print mode.

* * * * *